United States Patent
Olesiewicz et al.

(10) Patent No.: US 8,391,022 B2
(45) Date of Patent: Mar. 5, 2013

(54) MULTI-FUNCTION MEZZANINE BOARD ALIGNMENT AND MOUNTING DEVICE, WITH INTEGRATED HANDLE

(75) Inventors: Timothy W. Olesiewicz, Dublin, CA (US); David W. Hartwell, Bolton, MA (US); Brett C. Ong, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 1248 days.

(21) Appl. No.: 12/043,259

(22) Filed: Mar. 6, 2008

(65) Prior Publication Data
US 2009/0225527 A1  Sep. 10, 2009

(51) Int. Cl.
*H05K 7/02* (2006.01)

(52) U.S. Cl. ........ 361/810; 361/793; 361/709; 361/787; 361/790; 361/792; 361/794; 361/795; 361/803; 361/804; 361/807; 361/808; 361/809; 361/811; 361/812; 174/138 D; 174/138 G; 174/166 R; 174/166 S; 174/260; 174/261; 174/262; 174/263; 174/264; 174/265; 174/266

(58) Field of Classification Search .............. 361/386, 361/709, 784, 787, 790, 792–795, 803, 804, 361/807–812; 174/138 D, 138 G, 166 R, 174/166 S, 260–266
See application file for complete search history.

(56) References Cited

U.S. PATENT DOCUMENTS

| | | | | |
|---|---|---|---|---|
| 5,335,146 A * | 8/1994 | Stucke | ........................... | 361/785 |
| 5,575,686 A * | 11/1996 | Noschese | ................. | 439/620.21 |
| 5,963,432 A * | 10/1999 | Crowley | ........................ | 361/804 |
| 6,011,462 A * | 1/2000 | Cooper | ........................... | 340/442 |
| 6,533,587 B1 * | 3/2003 | Potter et al. | ..................... | 439/65 |
| 7,113,405 B2 * | 9/2006 | Armstrong et al. | ............ | 361/719 |
| 7,342,796 B2 * | 3/2008 | Aukzemas | ..................... | 361/719 |
| 7,349,218 B2 * | 3/2008 | Lu et al. | ......................... | 361/719 |
| 2005/0265002 A1 * | 12/2005 | Armstrong et al. | ........... | 361/719 |
| 2007/0014085 A1 * | 1/2007 | Meserth et al. | ................ | 361/685 |
| 2008/0089044 A1 * | 4/2008 | Fathauer et al. | ............... | 361/768 |

* cited by examiner

*Primary Examiner* — Xiaoliang Chen
(74) *Attorney, Agent, or Firm* — Osha Liang LLP

(57) ABSTRACT

A mezzanine board alignment and mounting device includes a multi-stage pin connected to a main board near a mezzanine board connector disposed on the main board. The multistage pin includes a base adapted to connect to the main board, a point distal to the base adapted to pass through an opening on a mezzanine board, and a support disposed between the base and the point. A diameter of the point widens towards the support. A diameter of the support is wider than a diameter of the opening. When the point is fully inserted through the opening in the mezzanine board, the mezzanine board is aligned properly to connect with the mezzanine board connector on the main board.

19 Claims, 7 Drawing Sheets

MULTI-FUNCTION MEZZANINE BOARD ALIGNMENT AND MOUNTING DEVICE, WITH INTEGRATED HANDLE

BACKGROUND

FIG. 1 shows a perspective view of a typical computer 100 where a top cover (not shown) of a chassis 101 is removed. As can be seen in FIG. 1, various kinds of electronic parts 102 are disposed on a main board 103 of the computer 100. The main board 103 is disposed on a bottom surface of the chassis 101 via supports 105.

FIG. 2 shows a perspective view of the computer 100 in FIG. 1 where a mezzanine board 201 is installed. For example, the mezzanine board 201 is fixed to the side surface of the chassis 101 by screws or adhesives. In order to properly mount the mezzanine board 201, the position of the mezzanine board 201 must be aligned relative to the main board 103 such that connectors on the mezzanine board 201 mate with connectors on the main board 103.

SUMMARY OF INVENTION

One or more embodiments of the present invention relate to a mezzanine board alignment and mounting device comprising a multi-stage pin connected to a main board near a mezzanine board connector disposed on the main board. The multistage pin includes a base adapted to connect to the main board, a point distal to the base adapted to pass through an opening on a mezzanine board, and a support disposed between the base and the point. A diameter of the point widens towards the support. A diameter of the support is wider than a diameter of the opening. When the point is fully inserted through the opening in the mezzanine board, the mezzanine board is aligned properly to connect with the mezzanine board connector on the main board.

Other aspects and advantageous of the invention will be apparent from the following description and appended claims.

DETAILED DESCRIPTION

Figure 1:
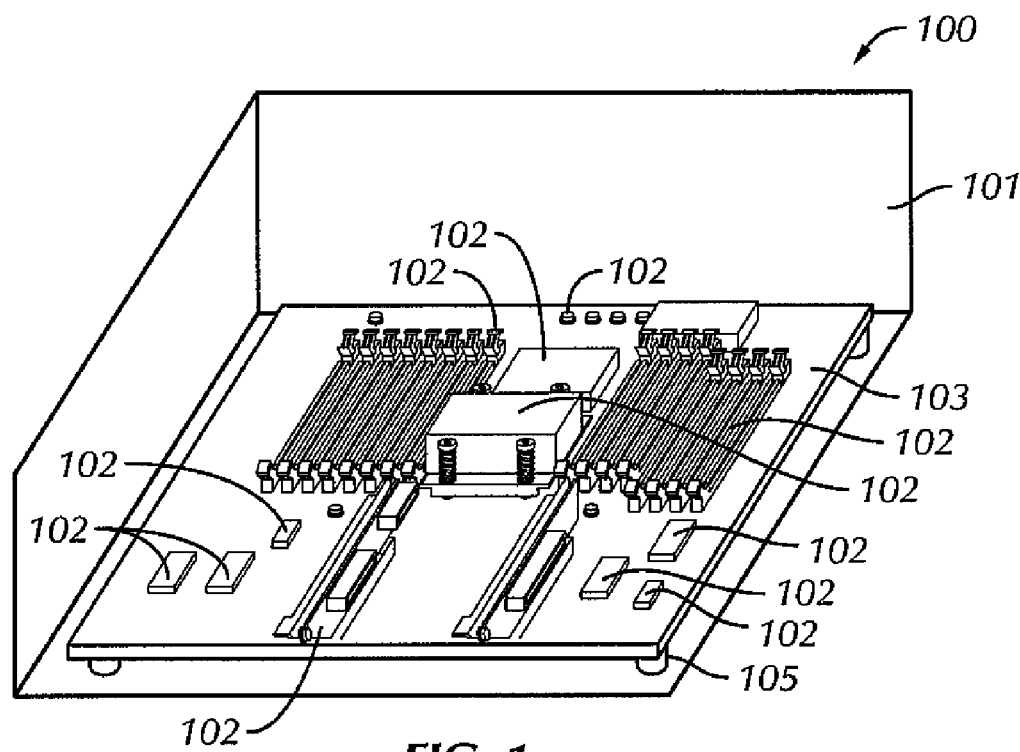
FIG. 1 shows a perspective view of a typical computer where a top cover of a chassis is removed.
Figure 2:
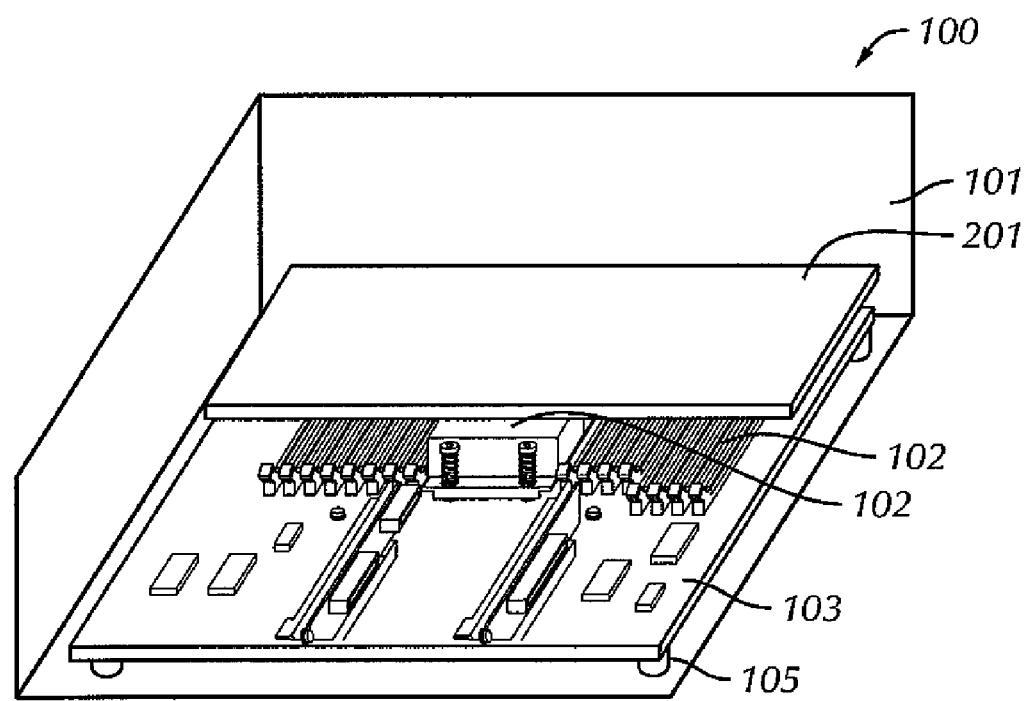
FIG. 2 shows a perspective view of the computer in FIG. 1 where a mezzanine board is installed.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 3:
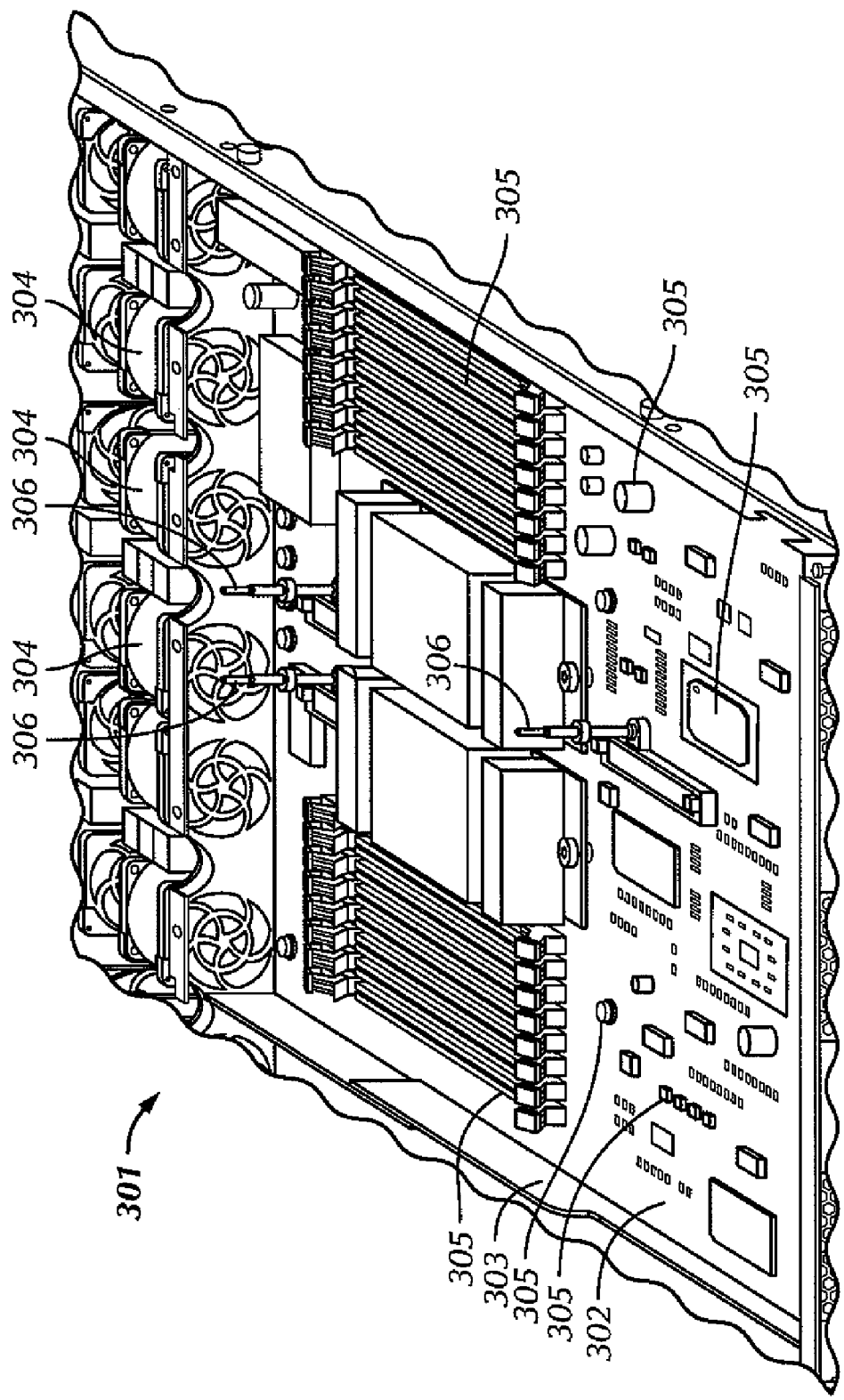
FIG. 3 shows a perspective view of a mezzanine board alignment and mounting device installed to a main board of a computer.

FIG. 3 shows a perspective view of a mezzanine board alignment and mounting device installed to a main board of a computer. As shown in FIG. 3, a computer 301 has a main board 302 enclosed in a chassis 303 and a plurality of fans 304. The main board 302 has a various electric parts 305 such as integrated circuits and a plurality of mezzanine board alignment and mounting devices 306 on the top surface of the main board 302. One skilled in the art will appreciate many other positions and/or numbers of fans 304, electric parts 305, and the plurality of mezzanine board alignment and mounting devices 306 that may be used according to the particular design of the computer.

Figure 4:
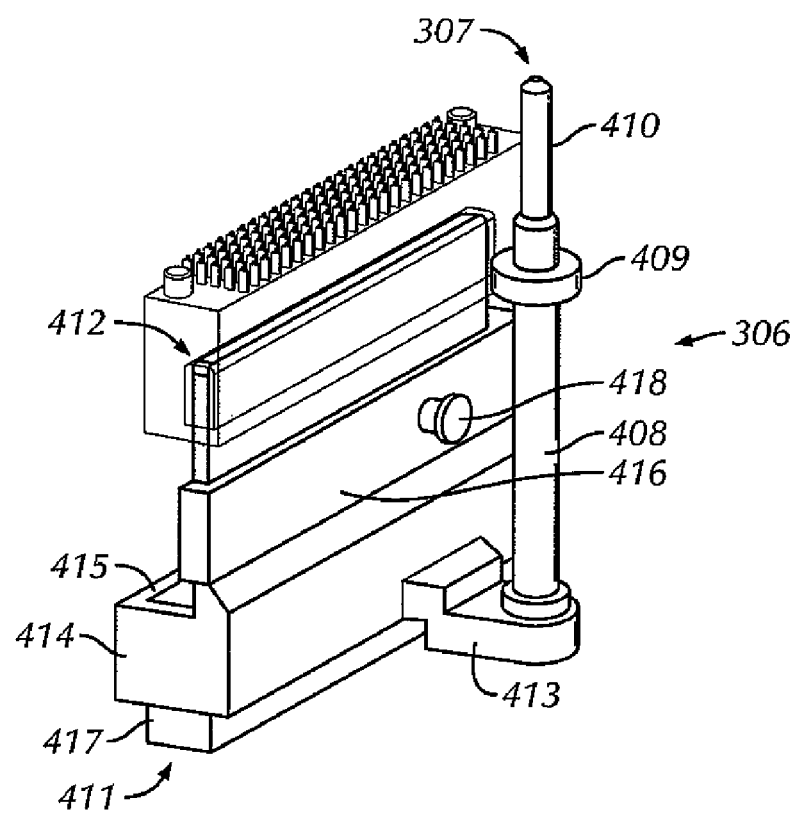
FIG. 4 shows an enlarged perspective view of the mezzanine board alignment and mounting device as shown in FIG. 3.
Figure 5:
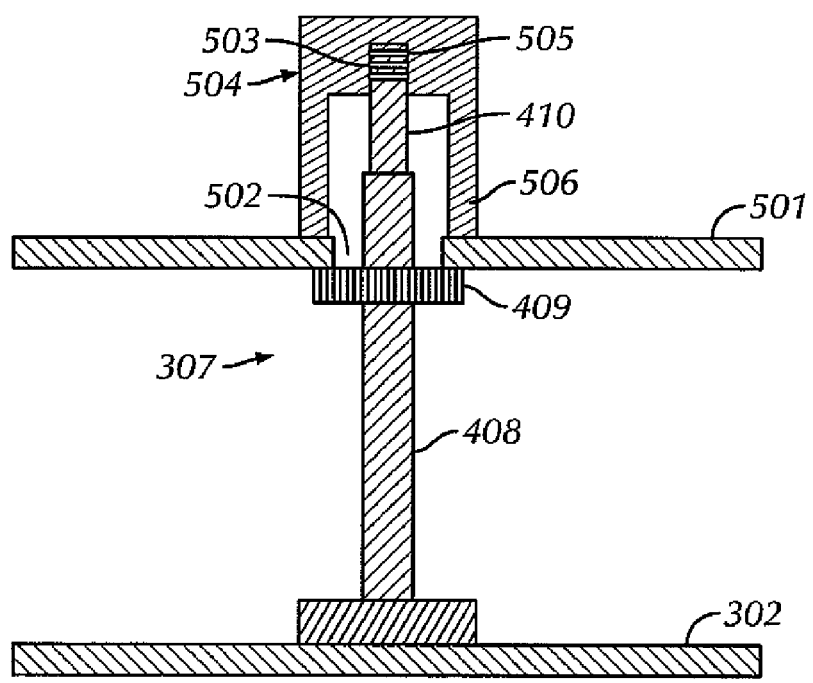
FIG. 5 shows a sectional view of the mezzanine board alignment device and the mezzanine board installed to the computer as shown in FIG. 3.

FIG. 4 shows an enlarged perspective view of the mezzanine board alignment and mounting device as shown in FIG. 3. FIG. 5 shows a sectional view of the mezzanine board alignment device and the mezzanine board installed to the computer as shown in FIG. 3. As shown in FIG. 4, the mezzanine board alignment and mounting device 306 has a multi-stage pin 307 that includes a base 408, a support 409, and a point 410. Also, the mezzanine board alignment and mounting device 306 may have a shroud 411 connected to the multi-stage pin 307.

As shown in FIG. 5, a mezzanine board 501 has an opening 502 and is supported by the multi-stage pin 307 around the opening 502 so that the mezzanine board 501 is positioned above the main board 302 and approximately parallel to the main board 302.

As shown in FIGS. 4 and 5, the base 408 is connected to the main board 302 at the bottom thereof by screws, adhesives, or other attachment methods known in the art. The base 408 has a cylindrical and slender shape. In one or more embodiments, a diameter of the base 408 may widen at the bottom thereof.

The support 409 is disposed between the base 408 and the point 410. The support 409 may have thin cylindrical shape. A diameter of the support 409 is wider than a diameter of the base 408. Also, the diameter of the support 409 is wider than the opening 502 of the mezzanine board 501 so that the mezzanine board 501 is supported by the support 409 around the opening 502 when the point 410 is inserted fully into the opening 502 of the mezzanine board 501. In addition, a position of the support 409 may be chosen according to the desired position of the mezzanine board 501.

The point 410 is distal to the base 408 and is positioned on the support 409. As shown in FIGS. 4 and 5, a diameter of the point 410 widens towards the support 409. In this embodiment, the point 410 has two diameters. Specifically, the diameter of the point 410 near the support 409 may be the same as the diameter of the base 408. The diameter of the point 410 around the top thereof is narrower than the diameter of the point 408 near the support 409. Further, the diameter of the point 410 near the support 409 is narrower than the diameter of the opening 502 of the mezzanine board 501. One skilled in the art will appreciate that the point 410 has more or less numbers of diameters so long as the mezzanine board 501 is aligned precisely as explained below.

The point 410 has a threaded portion 503 around the top thereof. Also, a connector 504 has a threaded portion 505 inside the connector 504. The treaded portion 503 is configured to engage with the threaded portion 505. Further, the connector 504 has a contact portion 506 at the side thereof. The contact portion 506 pushes a top surface of the mezzanine board 501 toward the support 409 by the engagement of the threaded portions 503 and 505.

Although the connector 504 and the point 410 have corresponding threaded portions as shown in FIG. 5, one, skilled in the art will appreciate other types of the connector may be employed so long as the connector fixes the mezzanine board tightly after aligning the position of the mezzanine board 501 relative to the multi-stage pin 307. Also, one of the ordinary skill in the art will appreciate that any other shapes and sizes of the point 410 as long as the diameter of the point 410 widens towards the support 409 and the point 410 functions properly in order to align the mezzanine board 501 as explained below. In addition, the point 410, the support 409, and the base 408 may be integrally formed or formed separately.

The shroud 411 has a connector 413 and a holder 414. One end of the connector 413 is connected to the base 408 around the bottom of the base 408. Although the end of the connector 413 is disposed at the bottom of the base, one skilled in the art will appreciate any other connections known in the art. Another end of the connector 413 is connected to a side of the holder 414. The holder 413 has two side plates 415 and 416 and a bottom plate 417. The side plate 416 may be higher than the side plate 415 such that one surface of the riser board 412 is disposed along an inside surface of the side plate 415 and is firmly supported by the side plate 416 when the riser board 412 is installed to the holder 414. Further, the side plate 416 may have an opening (not shown), and the riser board 412 has an opening (not shown). When the riser plate 412 is installed to the holder 414, the position of the opening of the side plate 416 corresponds to the opening of the riser board 412. The snap rivet 418 is attached to the openings of the side plate 416 and the riser board 412 so that the riser board 412 is more firmly held in the holder 414. One skilled in the art will appreciate any other positions of the opening and the rivet so long as the riser board 412 is firmly held in the holder 414. Also, one skilled in the art will appreciate any other sizes and shapes of the openings and the rivet so long as the riser board 412 is firmly held in the holder 414 and the alignment of the mezzanine board as explained below is not interrupted.

Figure 6:
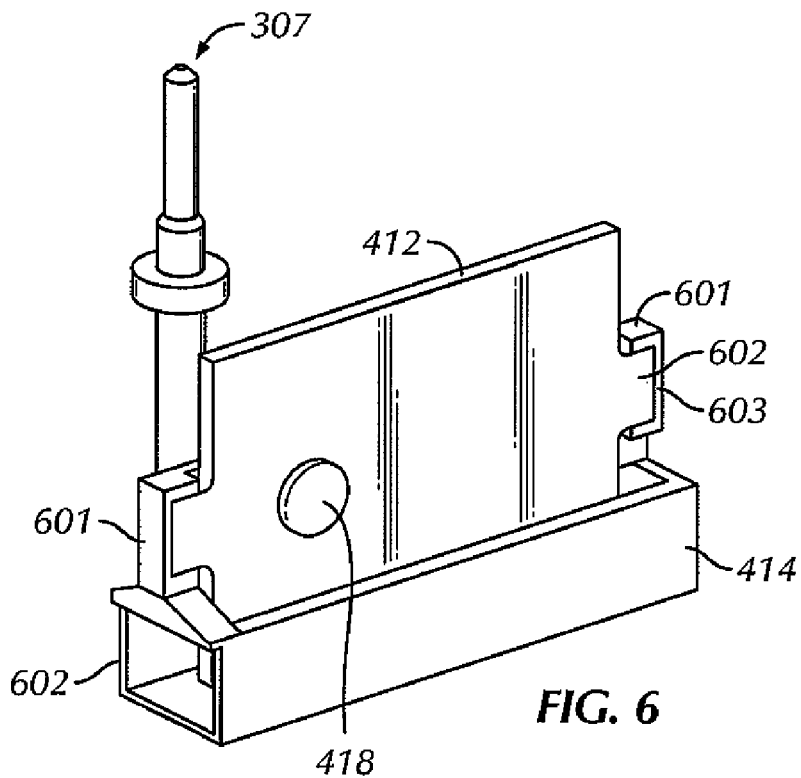
FIG. 6 shows a perspective view of the shroud in FIG. 4.

FIG. 6 shows a perspective view of the shroud in FIG. 4 from another angle. As can be seen in FIG. 6, the holder 414 has supports 601 at the side of the holder 414. The supports 601 have rectangular recess 603 respectively. The riser board 412 has rectangular projections 602 at the side of the riser boards. The size of the projections 602 are approximately the same as the recesses 603 so that when the riser board 412 is installed to the holder 414, the projections 602 fits to the recesses 603, and the riser board 412 may be tightly held in the holder 414. Although the recesses 603, the supports 601, and the projections 602 are rectangular in shape, one skilled in the art will appreciate any other shapes of the recesses, the supports and the projections so long as the riser board 412 is tightly held in the holder 414.

Figure 7:
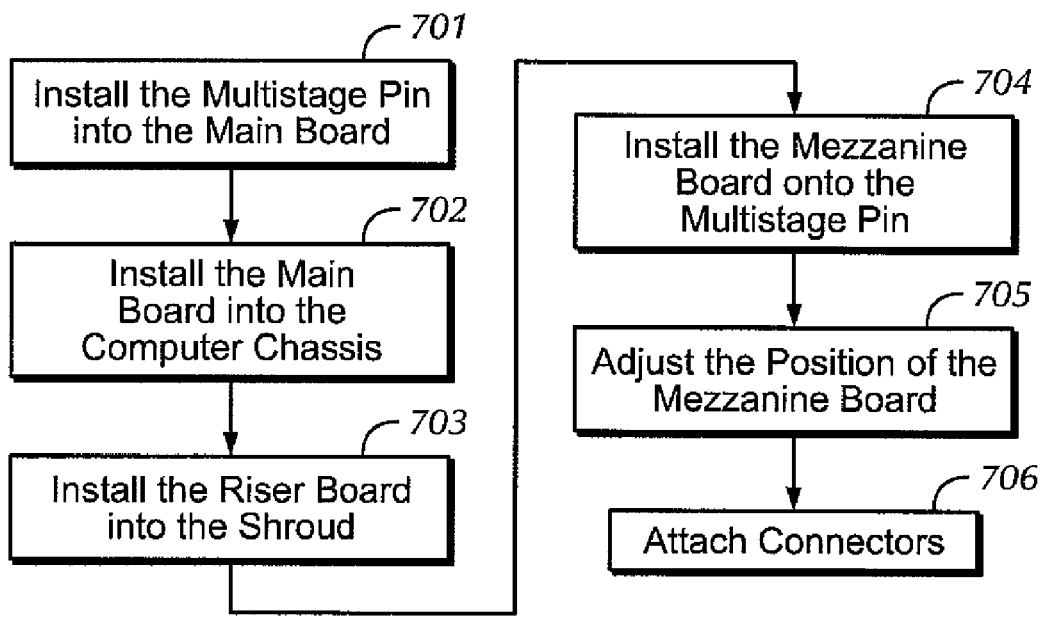
FIG. 7 shows a flow diagram of installing the mezzanine board to the main board.

FIG. 7 shows a flow diagram of installing the mezzanine board to the main board. In one or more embodiments of the invention, one or more steps described below may be omitted, repeated, and/or performed in a different order.

First, the base 408 of the multi-stage pin 307 is attached on the surface of the main board 302 (Step 701). A plurality of the multi-stage pins 307 may be attached. Second, the main board 302 is installed to the chassis 303 of the computer 301 using the support 409 as a handle (Step 702). At this time, the support 409 allows to handle a main board 302 easily. That is, the support functions as an integrated mother board handle. After the main board 302 is installed to a chassis 303 of the computer 301, the riser board 412 may be installed into the shroud 411 (Step 703). Specifically, the riser board 412 is inserted into the gaps between the side plates 415 and 416 along the side plate 416 until the bottom surface of the riser board 412 contacts to the bottom surface of the bottom plate 417, and the projections 602 of the riser board 412 is inserted to the recesses 603 of the holder 414. Then, the snap rivet 418, which may be made of a plastic, is attached to the openings (not shown) of the holder 414 and the riser board 412. As a result the riser board 412 is firmly fixed by the holder 414.

Next, the mezzanine board 501 is installed to the multi-stage pin 307 (Step 704). Specifically, the point 410 is inserted fully into the opening 502 of the mezzanine board 501 until a bottom surface of the mezzanine board 501 contacts the top surface of the support 409. At this time, the position of the mezzanine board 501 is adjusted roughly by the positions of the multi-stage pin 307 and the opening 502. In this sense, the mezzanine board alignment and mounting devise 306 has a self-aligning design. Then, the position of the mezzanine board 501 is aligned precisely (Step 705). Because the opening 502 of the mezzanine board 501 is wider than the diameter of the point 410 near the support 409, the position of the mezzanine board 501 is adjusted in a range of a gap between a outside surface of the point 410 near the support 409 and a side surface of the mezzanine board 501 forming the opening 502. After adjusting the position of the mezzanine board 501 precisely, the connector 504 is attached to a top of the point 410 (Step 706). Specifically, by rotating the connector 504, the connector 504 moves downwardly because of the engagement of the threads 503 and 505, and, then, the bottom surface of the contact portion 506 contacts to the top surface of the mezzanine board 501. As the connector 504 moves further downwardly, the connector 504 pushes the mezzanine board 501, and, finally, the mezzanine board 501 is firmly fixed to the support 409 at an adjusted position.

Figure 8:
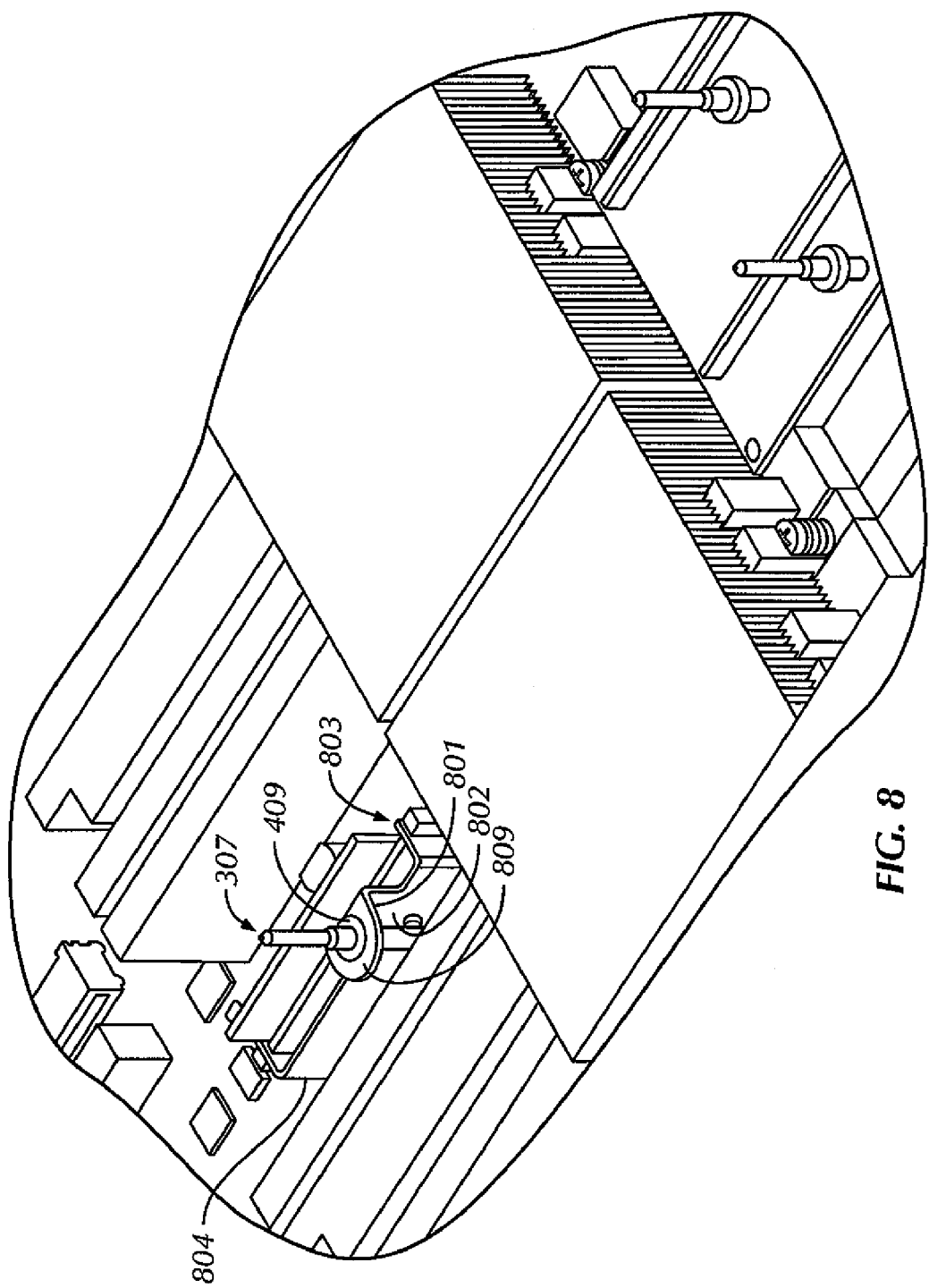
FIG. 8 shows a perspective view of a mezzanine board alignment and mounting device installed to a main board of a computer according to one or more embodiments of the present invention.

FIG. 8 shows a perspective view of a mezzanine board alignment and mounting device installed to a main board of a computer according to one or more embodiments of the present invention. The mezzanine board alignment and mounting device shown in FIG. 8 is similar to that shown in FIG. 3-6, but a shroud 803 is connected to the support 409 of the multi-stage pin 307. In this embodiment, one of the side plates 802 of a holder 804 has a connector 801 to connect the side plate 802 to the support 409. Specifically, the connector 801 has L shape and a top surface of the connector 801 is approximately perpendicular to the side plate 802 and approximately parallel to the support 409. The connector 801 may be formed integrally with the side plate 802. One skilled in the art will appreciate any other connectors so long as the shroud 803 is connected to the multi-stage pin 307, and the position of the mezzanine board 501 is precisely aligned as explained above. In this embodiment, the mezzanine board 501 is supported by both a top surface of the connector 801 and a top surface of the support 409 when the mezzanine board 501 is installed to the multi-stage pin 307. Otherwise, the elements and operation of the device are the same as that shown in FIGS. 3-7.

Figure 9:
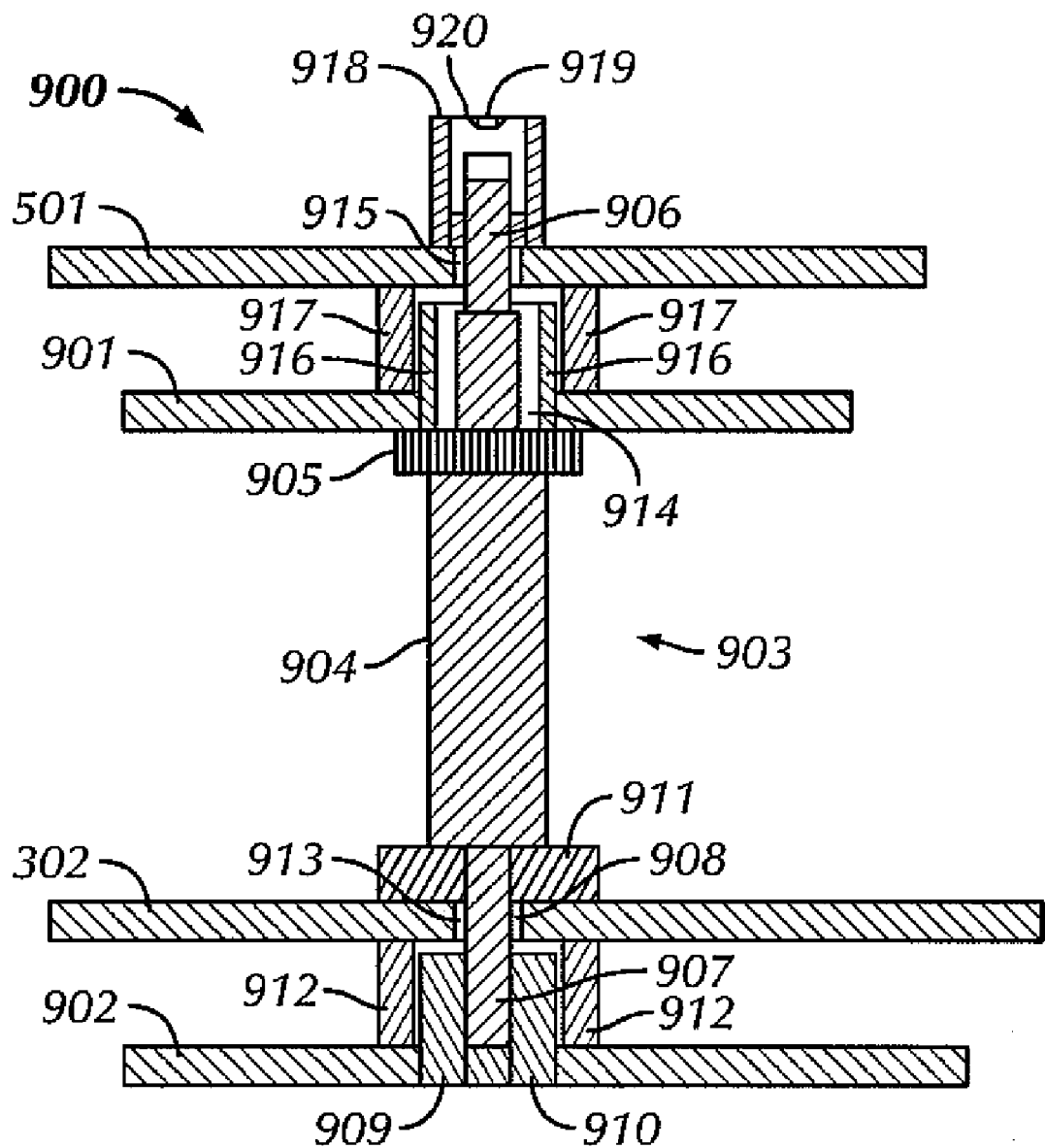
FIG. 9 shows a sectional view of a mezzanine board alignment and mounting device installed to a main board of a computer according to one or more embodiments of the present invention.

FIG. 9 shows a sectional view of a mezzanine board alignment and mounting device installed to a main board of a computer according to one or more embodiments of the present invention. In the embodiment shown, the mezzanine board alignment and mounting device 900 shown in FIG. 9 is similar to that shown in FIG. 3-6, but, in addition to the elements of the device shown in FIGS. 3-7, the device 900 has some additional parts such as a mezzanine tray 901 and main board tray 902 and a shape of a multi-stage pin 903 is a little bit different from the multi-stage pin as shown above.

Figure 10:
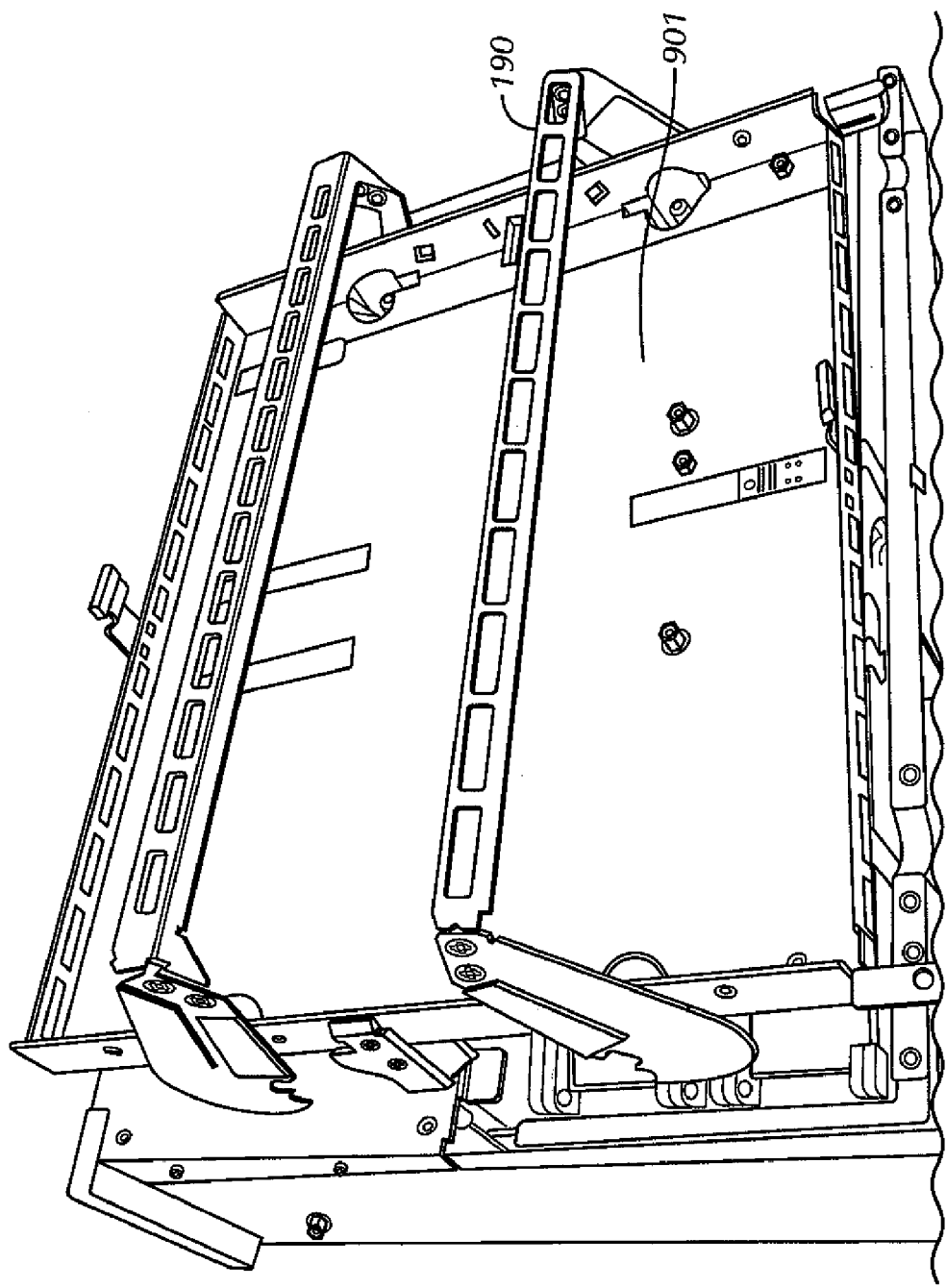
FIG. 10 shows a perspective view of a mezzanine tray installed to the multi-stage pin according to one or more embodiments of the present invention.

The mezzanine tray 901 is disposed approximately parallel to and below the mezzanine board 501. Similarly, the main board tray 902 is disposed approximately parallel to and below the main board 302. In addition, as shown in FIG. 10, the mezzanine tray 901 may have handles 190.

The mezzanine board alignment and mounting device 900 has a multi-stage pin 903 that includes a base 904, a support 905, and two points 906 and 907. The mezzanine board alignment and mounting device 900 may have the shroud 411 connected to the multi-stage pin 903.

One of the points 907 is disposed at a bottom surface of the base 904. The point 907 may be formed integrally with the base 904 and/or the support 905. A diameter of the point 907 is constant and is narrower than a diameter of the base 904. Also, a diameter of an opening 908 of the main board 302 is wider than a diameter of the point 907 so that the point 907 is inserted through the opening 908 of the main board 302. The main board tray 902 has an opening 909, and a position of the opening 909 is below the opening 908 of the main board 302. Further, the diameter of the opening 909 of the main board tray 902 is wider than the diameter of the opening 908 of the main board 302.

A standoff 910 is disposed at the opening 909 of the main board tray 902. A riser shroud 911 is disposed between the bottom surface of the base 904 and the top surface of the main board 302. Thus, the point 907 is supported by the riser shroud 911 and by the standoff 910. In addition, the riser shroud 911 may be a part of a connector of the shroud 413. Also, a spacer 912 may be inserted between the main board 302 and the main board tray 902 around the standoff 910. The spacer 912 and the riser shroud 911 may be made of plastic. Further, there may be a gap 913 between an outside surface of the main board 302 around the opening 908 and an outside surface of the point 907 so that a position of a multi-stage pin 903 relative to the main board 302 may be aligned in the range of the gap 913 before fixing the multi-stage pin 903 to the main board 302.

The point 906 is disposed on the support 905. The point 906 may be formed integrally with base 904 and/or the support 905. In this embodiment, the point 906 has two diameters. Specifically, a diameter of the point 906 near a top of the point 906 is narrower than a diameter of the point 906 near the bottom thereof. The diameter of the point 906 near the support 905 is narrower than the diameter of the opening 914 of the mezzanine tray 901 such that the point 906 is fully inserted into the opening 906. Also, a diameter of the point 906 near a top thereof is narrower than an opening 915 of the mezzanine board 501. Further, the diameter of the opening 915 of the mezzanine board 501 is narrower than the diameter of the opening 914 of the mezzanine tray 901. Thus, there is a gap between the side surface of the mezzanine board 501 forming the opening and the outside surface of the point 906 near the support so that the mezzanine board 501 can be adjusted in a range of the gap precisely in a similar way as explained above.

In addition, the opening 914 of the mezzanine tray 901 is positioned below the opening 915 of the mezzanine board 501. At the opening 914 of the mezzanine tray 901, a standoff 916 is disposed. A spacer 917 is disposed around the standoff 916 and between the mezzanine board 501 and the mezzanine tray 901.

A thumb nut assembly 918 is disposed on the opening 915 of the mezzanine board 501. The thumb nut assembly 918 has a screw head 919 at the top surface 920 thereof and a thread (not shown) inside thereof. The top of the point 906 is inserted into the opening 915 of the mezzanine board 501. Further, the top of the point 906 is threaded and engages with the thread of the thumb nut assembly 918 so that the mezzanine board 501 is fixed firmly to the multi-stage pin 903 by the thumb nut assembly 918 after aligning the position of the mezzanine board precisely.

The flow of installing the mezzanine board 501 to the main board 302 is similar to that shown in FIG. 7, but in addition to the flow shown in FIG. 7, the flow in this embodiment includes at least that the point 906 is inserted into the opening 915 of the mezzanine tray 901 when installing a mezzanine board tray to the multi-stage pin 903. Here, the standoff 916 and the spacer 917 may be disposed to each position as explained above before. Then, the mezzanine board 501 is disposed on the spacer 917, in other words, the point 906 is inserted into the opening 915 of the mezzanine board 501. Next, after the position of the mezzanine board 501 is aligned precisely in a range of a gap between side surface of the mezzanine board forming the opening 915 of the mezzanine board 501 and the outside surface of the point 906, the thumb nut assembly 918 is fastened by a screw driver (not shown) to fix the aligned position of the mezzanine board 501 to the multistage-pin 903.

One or more embodiments of the present invention may have one or more of the following advantages. The position of a mezzanine board is always aligned precisely during mounting. Specifically, the position of the mezzanine board is aligned roughly at first based on an opening of the mezzanine board, and, then, the position of the mezzanine board is aligned precisely and fixed. It is not necessary to use any tools to install a riser board. A mounted riser board may serve as an insulating shroud. Also, a support of a multi-stage pin serves as a handle of a main board when installing the main board to a computer chassis.

While the invention has been described with respect to a limited number of embodiments, those skilled in the art, having benefit of this disclosure, will appreciate that other embodiments can be advised which do not depart from the scope of the invention as disclosed therein. Accordingly, the scope of the invention should be limited only by the attached claims.

What is claimed is:

1. A mezzanine board alignment and mounting device comprising:
   a multi-stage pin connected to a main board near a mezzanine board connector disposed on the main board;
   the multistage pin comprising:
      a base adapted to connect to the main board;
      a point distal to the base adapted to pass through an opening on a mezzanine board; and
      a support with a flat upper surface disposed between the base and the point,
   wherein a diameter of the point widens towards the support,
   wherein a diameter of the support is wider than a diameter of the opening and acts as a positive stop to the passing of the multistage pin through the opening, and wherein when the point is fully inserted through the opening in the mezzanine board, the mezzanine board is aligned properly to connect with the mezzanine board connector on the main board and the mezzanine board rests on the flat upper surface of the support.

2. The mezzanine board alignment and mounting device of claim 1, wherein the support is formed such that, when not supporting a mezzanine board, the support functions as a handle for the main board.

3. The mezzanine board alignment and mounting device of claim 1, wherein the base of the multi-stage pin comprises a snap rivet.

4. The mezzanine board alignment and mounting device of claim 1, wherein multiple multi-stage pins are disposed at different locations on the main board.

5. The mezzanine board alignment and mounting device of claim 1, wherein the point widens in a uniform manner such that a gap between an inside surface the mezzanine board forming the opening and the point is a range for the mezzanine board to be aligned.

6. The mezzanine board alignment and mounting device of claim 1, wherein the multi-stage pin is cylindrical.

7. The mezzanine board alignment and mounting device of claim 1, further comprising a holder attached to the base and configured to hold a bottom part of a riser board perpendicularly.

8. The mezzanine board alignment and mounting device of claim 1, wherein the point comprises a thread, and wherein the connector comprises a threaded insert configured to engage with the thread.

9. The mezzanine board alignment and mounting device of claim 8, the connector has a screw head at the top thereof.

10. The mezzanine board alignment and mounting device of claim 1, further comprising:
a mezzanine tray disposed below the mezzanine board; and
a spacer,
wherein the mezzanine tray has an opening such that the point passes through.

11. The mezzanine board alignment and mounting device of claim 10, wherein a diameter of the opening of the mezzanine tray is wider than the diameter of the opening of the mezzanine board.

12. The mezzanine board alignment and mounting device of claim 10, wherein the mezzanine tray is disposed on the support around the point.

13. The mezzanine board alignment and mounting device of claim 11, wherein the diameter of the support is wider than the diameter of the opening of the mezzanine tray.

14. The mezzanine board alignment and mounting device of claim 10, further comprises a spacer configured to insert between the mezzanine tray and the mezzanine board.

15. The mezzanine board alignment and mounting device of claim 10, wherein the diameter of the base is narrower than the diameter of the point near the support.

16. The mezzanine board alignment and mounting device of claim 1, wherein the point comprises at least two diameters.

17. The mezzanine board alignment and mounting device of claim 10, wherein the mezzanine tray has at least a handle.

18. The mezzanine board alignment and mounting device of claim 16, wherein a first tapered surface is disposed at a distal end of the point and a second tapered surface is disposed between the at least two diameters.

19. The mezzanine board alignment and mounting device of claim 1, wherein a length of the multistage pin from the base to the flat upper surface of the support is set such that the mezzanine board is properly connected with the mezzanine board connector on the main board when the mezzanine board rests on the flat upper surface of the support.

* * * * *